United States Patent
Mukherjee et al.

(10) Patent No.: US 9,473,179 B2
(45) Date of Patent: Oct. 18, 2016

(54) METHODS AND APPARATUSES FOR LTE SIGNAL DETECTION AND CLASSIFICATION BY A WI-FI RECEIVER

(71) Applicant: NOKIA CORPORATION, Espoo (FI)

(72) Inventors: Amitav Mukherjee, Santa Clara, CA (US); Sayantan Choudhury, Berkeley, CA (US)

(73) Assignee: NOKIA TECHNOLOGIES OY, Espoo (FI)

( * ) Notice: Subject to any disclaimer, the term of this patent is extended or adjusted under 35 U.S.C. 154(b) by 851 days.

(21) Appl. No.: 13/740,863

(22) Filed: Jan. 14, 2013

(65) Prior Publication Data
US 2014/0199991 A1    Jul. 17, 2014

(51) Int. Cl.
*H03M 13/00*    (2006.01)
(52) U.S. Cl.
CPC ........ *H03M 13/6525* (2013.01); *H03M 13/612* (2013.01)
(58) Field of Classification Search
CPC ............ H04W 72/1215; H04W 24/00; H04W 72/0406; H04W 84/047; H03M 13/6525; H03M 13/612
See application file for complete search history.

(56) References Cited

U.S. PATENT DOCUMENTS

| | | | | |
|---|---|---|---|---|
| 7,274,744 | B2 * | 9/2007 | Lozhkin | H04L 5/06 370/203 |
| 8,385,961 | B1 * | 2/2013 | Christensen | H04W 56/00 370/324 |
| 2003/0179737 | A1 * | 9/2003 | Dor | H04B 1/7075 370/342 |
| 2009/0132865 | A1 * | 5/2009 | Meng | H04L 41/0613 714/48 |
| 2012/0195212 | A1 * | 8/2012 | Zhang | H04W 72/1215 370/252 |
| 2012/0219096 | A1 * | 8/2012 | Larsson | H04L 1/0046 375/341 |
| 2012/0238267 | A1 * | 9/2012 | Kim | H04L 27/0006 455/434 |

OTHER PUBLICATIONS

Abdelaziz Bouzegzi et al., "Maximum Likelihood Based Methods for OFDM Intercarrier Spacing Characterization", pp. 1-5.

\* cited by examiner

*Primary Examiner* — Joseph Dean, Jr.
(74) *Attorney, Agent, or Firm* — Squire Patton Boggs (US) LLP (57) ABSTRACT

Methods, apparatuses, and computer program products for signal detection and classification are provided. One method includes detecting, by a station, a presence of a signal and classifying the signal according to type. There may be at least three possibilities for the type of signal. The classifying may include performing a composite hypothesis test, such as a generalized likelihood ratio test (GLRT) for the at least three possibilities.

31 Claims, 6 Drawing Sheets

METHODS AND APPARATUSES FOR LTE SIGNAL DETECTION AND CLASSIFICATION BY A WI-FI RECEIVER

BACKGROUND

1. Field

Embodiments of the invention generally relate to wireless communication systems, such as, but not limited to, the Universal Mobile Telecommunications System (UMTS) Terrestrial Radio Access Network (UTRAN), Long Term Evolution (LTE) Evolved UTRAN (E-UTRAN), and/or LTE-Advanced (LTE-A). Some embodiments relate to signal detection and classification in such communication systems.

2. Description of the Related Art

Universal Mobile Telecommunications System (UMTS) Terrestrial Radio Access Network (UTRAN) refers to a communications network including base stations, or Node Bs, and for example radio network controllers (RNC). UTRAN allows for connectivity between the user equipment (UE) and the core network. The RNC provides control functionalities for one or more Node Bs. The RNC and its corresponding Node Bs are called the Radio Network Subsystem (RNS). In case of E-UTRAN (enhanced UTRAN) no RNC exists and most of the RNC functionalities are contained in the eNodeB (evolved Node B, also called E-UTRAN Node B).

Long Term Evolution (LTE) or E-UTRAN refers to improvements of the UMTS through improved efficiency and services, lower costs, and use of new spectrum opportunities. In particular, LTE is a 3rd generation partnership project (3GPP) standard that provides for uplink peak rates of at least 50 megabits per second (Mbps) and downlink peak rates of at least 100 Mbps. LTE supports scalable carrier bandwidths from 20 MHz down to 1.4 MHz and supports both Frequency Division Duplexing (FDD) and Time Division Duplexing (TDD). Advantages of LTE are, for example, high throughput, low latency, FDD and TDD support in the same platform, an improved end-user experience, and a simple architecture resulting in low operating costs.

Further releases of 3GPP LTE (e.g., LTE Rel-11, LTE-Rel-12) are targeted towards future international mobile telecommunications advanced (IMT-A) systems, referred to herein for convenience simply as LTE-Advanced (LTE-A). LTE-A is directed toward extending and optimizing the 3GPP LTE radio access technologies. A goal of LTE-A is to provide significantly enhanced services by means of higher data rates and lower latency with reduced cost. LTE-A will be a more optimized radio system fulfilling the international telecommunication union-radio (ITU-R) requirements for IMT-Advanced while keeping the backward compatibility.

SUMMARY

One embodiment is directed to a method including detecting, by a station, a presence of a signal, and classifying the signal according to type. In one embodiment, there are at least three possibilities for the type of signal. The classifying may include performing a composite hypothesis test, such as a generalized likelihood ratio test (GLRT) for the at least three possibilities.

Another embodiment includes an apparatus. The apparatus includes at least one processor, and at least one memory including computer program code. The at least one memory and computer program code, with the at least one processor, cause the apparatus at least to detect the presence of a signal, and to classify the signal according to type. In one embodiment, there are at least three possibilities for the type of signal. The apparatus may be further caused to classify the signal by performing a generalized likelihood ratio test (GLRT) for the at least three possibilities.

Another embodiment is directed to a computer program embodied on a computer readable medium. The computer program is configured to control a processor to perform a process. The process includes detecting a presence of a signal, and classifying the signal according to type. In one embodiment, there are at least three possibilities for the type of signal. The classifying may include performing a generalized likelihood ratio test (GLRT) for the at least three possibilities.

Another embodiment is directed to a method including collecting, by an access point, individual posterior probabilities from a plurality of stations. The method may further include using an arbitrary fusion rule to compute a global prior probability from individual posterior probabilities. In an embodiment, the global prior probability is to be used for a next detection period. The method may further include broadcasting the computed global prior probability to the plurality of stations.

Another embodiment includes an apparatus. The apparatus includes at least one processor, and at least one memory including computer program code. The at least one memory and computer program code, with the at least one processor, cause the apparatus at least to collect individual posterior probabilities from a plurality of stations, and to use an arbitrary fusion rule to compute a global prior probability from individual posterior probabilities. In an embodiment, the global prior probability is to be used for a next detection period. The apparatus may be further caused to broadcast the computed global prior probability to the plurality of stations.

Another embodiment is directed to a computer program embodied on a computer readable medium. The computer program is configured to control a processor to perform a process. The process includes collecting individual posterior probabilities from a plurality of stations. The process may further include using an arbitrary fusion rule to compute a global prior probability from individual posterior probabilities. In an embodiment, the global prior probability is to be used for a next detection period. The process may further include broadcasting the computed global prior probability to the plurality of stations.

BRIEF DESCRIPTION OF THE DRAWINGS

For proper understanding of the invention, reference should be made to the accompanying drawings, wherein.

DETAILED DESCRIPTION

It will be readily understood that the components of the invention, as generally described and illustrated in the figures herein, may be arranged and designed in a wide variety of different configurations. Thus, the following detailed description of embodiments of methods, systems, apparatuses, and computer program products for signal detection and classification, as represented in the attached figures, is not intended to limit the scope of the invention, but is merely representative of selected embodiments of the invention.

If desired, the different functions discussed below may be performed in a different order and/or concurrently with each other. Furthermore, if desired, one or more of the described functions may be optional or may be combined. As such, the following description should be considered as merely illustrative of the principles, teachings and embodiments of this invention, and not in limitation thereof.

Signal detection and classification is an important first step in the establishment and synchronization of wireless communication links. For example, the start-of-packet detection in Wi-Fi networks is essential for accurate data reception and decoding. Similarly, primary synchronization sequence (PSS) detection in LTE may be required for acquisition of the downlink frame timing during cell search. Therefore, degradation of signal detection performance can severely impact the reliability of wireless radio links due to high false alarms and missed detection of packets. This is especially true when receivers operate in an interference environment where multiple transmitters of different technologies may be simultaneously active. One example is the scenario where LTE/LTE-A and Wi-Fi networks (802.11a/g/n/ac/af) coexist in Television Band White Space (TVWS) in a license-exempt operating mode.

Current autocorrelation (energy detection)-based methods of signal detection in Wi-Fi perform poorly under co-channel interference (e.g., by LTE or other wireless technologies transmitting in the same band), leading to high false-alarm and packet missed detection rates. Accordingly, certain embodiments of the invention provide a sophisticated and robust signal detection and classification algorithm based on cooperative sensing which is designed to operate in an interference environment.

For example, some embodiments of the invention provide a robust signal detection and classification mechanism for Wi-Fi receivers, such as multiple-input multiple-output (MIMO)—orthogonal frequency division multiplexing (OFDM) WiFi receivers, operating in the same spectrum as LTE or a similar wireless area network (WAN) technology.

One embodiment provides the robust signal detection and classification mechanism mentioned above based, for example, on distributed detection. An embodiment may be applicable for a multi-antenna OFDM receiver operating in an interference environment. One aspect of the invention includes the exchange of prior decisions (indicating the likelihood of LTE transmissions measured over a given time interval) between stations (STAs) to improve their detection accuracy, either directly or with the assistance of an access point (AP). According to certain embodiments, the STAs may be any device capable of using the 802.11 wireless protocol. For example, an STA may be a mobile phone, laptop, tablet, desktop computer, or other mobile or stationary device.

According to an embodiment, when direct message (probability) exchange is desired, the STAs may send their messages embedded in control packets such as request to send (RTS), clear to send (CTS), power save (PS)-Poll and ACK, either by using reserved bits in the SIG field or by defining a new field used exclusively for these messages. Alternatively, one embodiment provides a new feedback method by which the AP can collect the detection decisions from different STAs in the network. For the case of low-power terminals that are not monitoring the channel continuously, the AP may collect the individual probabilities from the STAs and broadcast them back to the base station subsystem (BSS). For active STAs, the STAs monitor the network and can autonomously compute the a priori information or refine the proposed a priori from the AP based on local estimates. In both cases, each STA uses these posterior probability values to generate a prior probability value for each hypothesis in the next detection period.

Some embodiments can be applied, for example, to the detection of interfering LTE signals at a WiFi STA in order to initiate interference avoidance mechanisms, such as switching to a different channel, and the start-of-packet detection of a WiFi transmission under co-channel interference from LTE. If the STAs can correctly detect the presence of an LTE signal instead of assuming another STA is active, they can immediately move to another channel instead of commencing collision avoidance back-off procedures.

According to one embodiment, it is assumed that LTE eNB/UEs and Wi-Fi devices share the same frequency band. Wi-Fi operates under a distributed coordination function (DCF) protocol (based on carrier sense multiple access (CSMA)/collision avoidance (CA) mechanism), while conventional LTE uplink (UL)/downlink (DL) frames are generated from the predefined frame structures (see, e.g., 3GPP TS 36.211; Physical Channels and Modulation (Release 10)).

The signal detection and classification method, according to some embodiments, are applicable to the following scenarios: (1) WiFi STA attempting to detect the presence of an LTE transmitter; (2) WiFi STA attempting to detect the start of a packet transmission from a WiFi transmitter. The following includes a detailed implementation for the first scenario, according to embodiments of the invention.

The general network model, according to an embodiment, is as follows. It is assumed that an arbitrary WiFi STA (receiver) is equipped with $N_r$ antennas and is coexisting in the same spectrum as a $N_t$-antenna LTE eNB (interferer), and a $N_t$-antenna WiFi transmitter. It is noted that the number of transmit antennas can be made arbitrary. The STA assumes any signal of interest spans up to N OFDM subcarriers, and therefore adopts a N-point fast fourier transform (FFT).

In one embodiment, the LTE signal of interest is assumed to be the primary synchronization sequence (PSS), which occupies 62 subcarriers around dc in the frequency domain, and is drawn from a Zadoff-Chu (ZC) sequence which has the following form:

$$Z_M^{G3}(n) = \exp\left[-j\frac{\pi M n(n+1)}{63}\right], \quad (1)$$
$$n = 0, \ldots, 62$$

with sequence root M=25, 29, or 34.

The WiFi signal is characterized by the short training field (STF) in the preamble, which occupies 52 subcarriers around direct current (dc) in the frequency domain with Quadrature phase-shift keying (QPSK) symbols placed on 12 subcarriers. In both cases, the dc subcarrier is left unoccupied. There is no coordinated medium access between the WiFi and LTE networks, and the STA performs signal classification and detection on a per-packet basis by exploiting PSS and STF to distinguish between signals.

Certain embodiments are easily extended to use LTE secondary synchronization sequence (SSS) and WiFi long training field (LTF), or any other sequence with known structure for signal detection and classification. However, it is noted that the fundamentally incompatible OFDM parameters of LTE and WiFi transmissions will cause sampling and frequency offsets at the WiFi STA when it tries to detect the PSS; these parameters are factored into the design of the robust detection method, according to certain embodiments.

Under this scenario, the WiFi STA desires to detect the presence of an LTE transmitter based on the PSS. There are three possibilities or hypotheses for the STA's received signal:

Hypothesis $H_0$: the received signal is only additive Gaussian noise.

Hypothesis $H_1$: the received signal is a WiFi signal plus Gaussian noise.

Hypothesis $H_2$: the received signal is a LTE signal plus Gaussian noise.

The three competing hypotheses are represented mathematically in the time-domain as:

$$Y = N \quad H_0:$$

$$Y = X_w H_w + N \quad H_1:$$

$$Y = X_l H_l + Z_l + N \quad (2) H_2:$$

where the received time-domain signal matrix Y is of dimension (N×$N_r$), the LTE and WiFi transmitters have $N_{t,L}$ and $N_{t,W}$ antennas, respectively, $H_w$ and $H_l$ are time-domain channel matrices of dimension ($LN_{t,W}$×$N_r$) and ($LN_{t,L}$×$N_r$), respectively, where L is the number of multipaths in the frequency-selective fading channels, $X_w$ is the WiFi STF of dimension (N×$LN_{t,W}$), $X_l$ is the LTE signal of dimension (N×$LN_{t,L}$), $Z_l$ is the time-domain inter-carrier interference (ICI) of dimension (N×$N_r$) due to LTE-WiFi technology mismatch, and N is zero-mean circularly symmetric complex additive white Gaussian noise: E{vec(N)vec(N)$^H$}=$\sigma_n^2$I. Since ICI $Z_l$ is modeled to be a deterministic function only of the LTE-WiFi frequency and sampling time offsets, it is estimated only once at initialization and treated as a known parameter thereafter. The initial maximum-likelihood estimate of the ICI is given by:

$$\hat{Z}_l = Y - X_l \hat{H}_l = (I - X_l(X_l^H X_l)^{-1} X_l^H) Y.$$

The channel matrices include the effects of sampling time offset $\Delta T$ and frequency offset $\Delta f$ between the respective transmitters and the STA and are treated as unknown parameters during every detection period. In the frequency domain, the propagation channel matrix on subcarrier k is multiplied by a complex exponential which models the cumulative effect of these offsets as follows:

$$\varphi_{k,m} = 2\pi \left[ \frac{k \Delta T_k}{NT} + \Delta f_k T \left(1 + \frac{\Delta T_k}{T}\right) \right] \left(mN + \frac{N-1}{2}\right) \quad (3)$$

where m is the OFDM symbol index and T is the symbol duration. The time-domain channel is obtained by a N-point IFFT of the frequency-domain overall channel matrix. The ICI in the frequency domain in the case of hypothesis $H_2$ has individual component on receive antenna j and subcarrier k given by:

$$W_j\left(k, \Delta f T, \frac{\Delta T}{T}\right) = \quad (4)$$

$$\frac{1}{\sqrt{N_s}} \sum_{\substack{v=-\frac{N_s}{2} \\ v \neq k}}^{\frac{N_s}{2}-1} \left\{ e^{j2\pi(k-v)f_\delta m T_b} \cdot e^{-j2\pi\left[\frac{k-v}{N_s} - \frac{v}{N_s}\frac{\Delta T}{T} - \Delta f T\left(1 + \frac{\Delta T}{T}\right)\right]\left(mN_b + \frac{N_s-1}{2}\right)} \cdot \right.$$

$$\left. \frac{\sin\left\{\pi\left[\frac{k-v}{N_s} - \frac{v}{N_s}\frac{\Delta T}{T} - \Delta f T\left(1 + \frac{\Delta T}{T}\right)\right]N_s\right\}}{\sin\left\{\pi\left[\frac{k-v}{N_s} - \frac{v}{N_s}\frac{\Delta T}{T} - \Delta f T\left(1 + \frac{\Delta T}{T}\right)\right]\right\}} \cdot \sum_{i=1}^{N_t} X_i(v) H_{ji}(v f \delta) \right\}$$

where $f_\delta$ is the subcarrier spacing and $N_s$=N. The time-domain ICI matrix $Z_l$ is then obtained by an IFFT of the frequency-domain overall ICI matrix W.

The conventional signal detection algorithm in WiFi is based on autocorrelation of the received signal (energy detection), which has the form of the following threshold test: Tr(YY$^H$)⋝η. Since the conventional scheme is designed for a binary hypothesis test (H0 and H1 only), it will fail to achieve a signal classification probability better than 0.5 in LTE-WiFi coexistence scenarios.

An extension to the conventional scheme would be to use a 2-stage detector with autocorrelation in the first stage to distinguish between noise-only and the presence of a signal, followed by a cross-correlation of Y with $X_w$, and $X_l$ in the second stage. This 2-stage process, however, is guaranteed to perform worse than the generalized likelihood ratio test (GLRT) provided by certain embodiments discussed below, since embodiments optimally perform the signal detection and classification jointly in a single stage, and also compensate for the unknown channel matrices, LTE-WiFi technology mismatch, and ICI.

In one embodiment, the WiFi STA decides whether a signal is present or not, and the type of the signal, such as a LTE or WiFi signal, based on the model in (2) outlined above. A false alarm occurs, for example, when either hypothesis H1 or H2 is estimated although the null hypothesis H0 is the true state of the system. For robustness, it is assumed that the channel matrices $H_w$ and $H_l$ are unknown at the STA during each detection phase. Therefore, embodiments provide a generalized likelihood ratio test (GLRT) approach for the signal detection and classification problem with deterministic unknown parameters, which is designed to meet a predefined false-alarm probability criterion. Ideally, the false-alarm probability should approach zero while the probability of correct signal classification should approach one.

Figure 1:
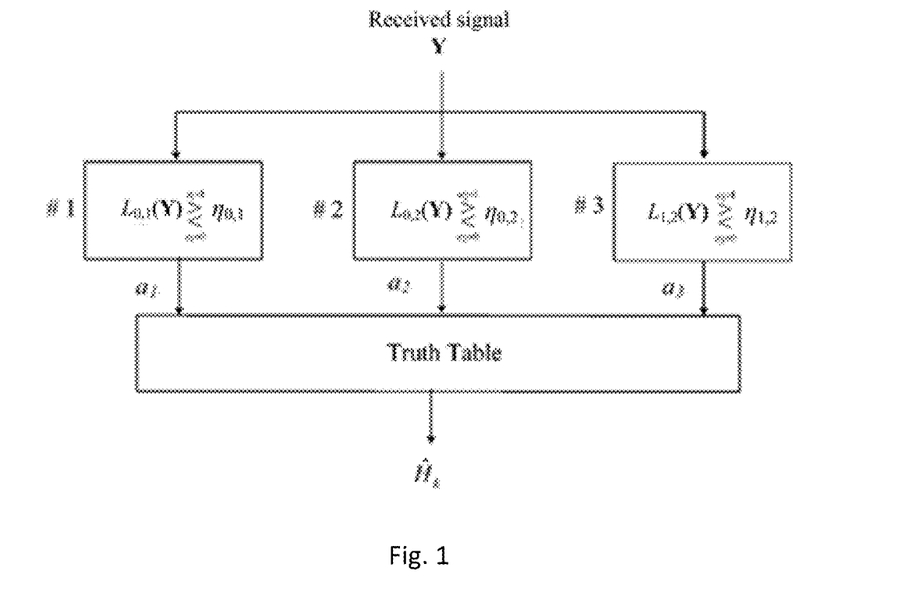
FIG. 1 illustrates an example of a block diagram implementation of the GLRT, according to one embodiment.

FIG. 1 illustrates an example of a block diagram implementation of the GLRT, according to one embodiment. In this example, the GLRT may include a bank of three parallel threshold tests, where the likelihood ratios of the different hypotheses are compared with a set of thresholds. The outcomes of the individual tests are represented with binary bits $a_1$, $a_2$, $a_3$, which are then fed into a digital logic circuit to compute the final estimate of the hypothesis believed to be true, as shown in Table I. For example, if the likelihood ratio $L_{0,1}$(Y) defined in (9) is less than the test threshold $\eta_{0,1}$, we set bit $a_1$=0.

TABLE I

Truth table of parallel hypothesis testing

| $a_1$ | $a_2$ | $a_3$ | $\hat{H}_i, i = 0, 1, 2$ |
|---|---|---|---|
| 0 | 0 | 0 | $\hat{H}_0$ |
| 0 | 0 | 1 | $\hat{H}_0$ |
| 0 | 1 | 0 | $\hat{H}_2$ |
| 0 | 1 | 1 | $\hat{H}_2$ |
| 1 | 0 | 0 | $\hat{H}_1$ |
| 1 | 0 | 1 | $\hat{H}_1$ |
| 1 | 1 | 0 | $\hat{H}_1$ |
| 1 | 1 | 1 | $\hat{H}_2$ |

In the following, the details of the parallel likelihood ratio tests are specified. Given the assumptions in (2), the received signal follows a complex Gaussian matrix distribution for each of the 3 hypotheses:

$$Y \sim CN(0, \sigma_n^2 I) \quad H_0:$$

$$Y \sim CN(X_w H_w, \sigma_n^2 I) \quad H_1:$$

$$Y \sim CN(X_l H_l + Z_l, \sigma_n^2 I) \quad (5) H_2:$$

The corresponding probability density functions conditioned on the unknown parameters for the respective hypotheses are given by:

$$f(Y; H_0) = \frac{1}{(\pi \sigma_n^2)^{NN_r}} \exp\left\{-\frac{Tr(Y^H Y)}{\sigma_n^2}\right\} \quad (6)$$

$$f(Y; H_1) = \frac{1}{(\pi \sigma_n^2)^{NN_r}} \exp\left\{-\frac{Tr((Y - X_w H_w)^H (Y - X_w H_w))}{\sigma_n^2}\right\} \quad (7)$$

$$f(Y; H_2) = \frac{1}{(\pi \sigma_n^2)^{NN_r}} \exp\left\{-\frac{Tr((Y - X_l H_l - Z_l)^H (Y - X_l H_l - Z_l))}{\sigma_n^2}\right\} \quad (8)$$

The likelihood ratio tests in FIG. 1 are then obtained to be of the form:

$$L_{i,j}(Y) = \frac{f(Y; H_j)}{f(Y; H_i)} \lessgtr \eta_{i,j} \quad (9)$$

$$i, j = 0, 1, 2, i < j$$

where the unknown parameters $H_w$ and $H_l$ are replaced with their maximum likelihood estimates:

$$\hat{H}_w = (X_w^H X_w)^{-1} X_w^H Y$$

$$\hat{H}_l = (X_l^H X_l)^{-1} X_l^H Y. \quad (10)$$

Equivalently, in an embodiment, the comparisons may be made based on the logarithm of the likelihood ratios. The selection of the test thresholds $\eta_{i,j}$ is important in achieving a desired detection performance.

If a priori information is available regarding the likelihood of each hypothesis, then the optimal thresholds are the ratios of these a priori probabilities. STAs can exchange their individual posterior probabilities to improve their overall detection performance.

If no such a priori information is available (such as during the initialization phase) or is outdated, then the thresholds are selected by the STA based on a local GLRT to ensure that the global false alarm probability $P_{FA}$ is constrained below a threshold (e.g., $10^{-3}$) In this case, the thresholds can be computed offline for different signal-to-noise ratio (SNR) levels.

In one embodiment, the a priori probabilities of each hypothesis at an arbitrary STA s and detection time t are provided as:

$$P_{s,0}^{(t)} = Pr\{H_0;t\} P_{s,1}^{(t)} = Pr\{H_1;t\} P_{s,2}^{(t)} = Pr\{H_2;t\}$$

The posterior classification probability for each hypothesis that is computed for a given detection time or averaged over a window of consecutive decisions can be used by the STA as a local a priori probability for future time slots. Each STA can update its a priori information by using an arbitrary fusion rule for its local past observations and probabilities received from neighboring STAs. When a priori information is available at an STA, its detection process is slightly modified: the optimal likelihood ratio test thresholds $\eta_{i,j}$ in (9) are then set to be the ratios of these a priori probabilities.

Embodiments of the invention provide at least two scenarios of message (probability value) exchanges: Direct message exchange between STAs (see FIG. 2); and AP-assisted message exchange (see FIG. 3).

Figure 2:
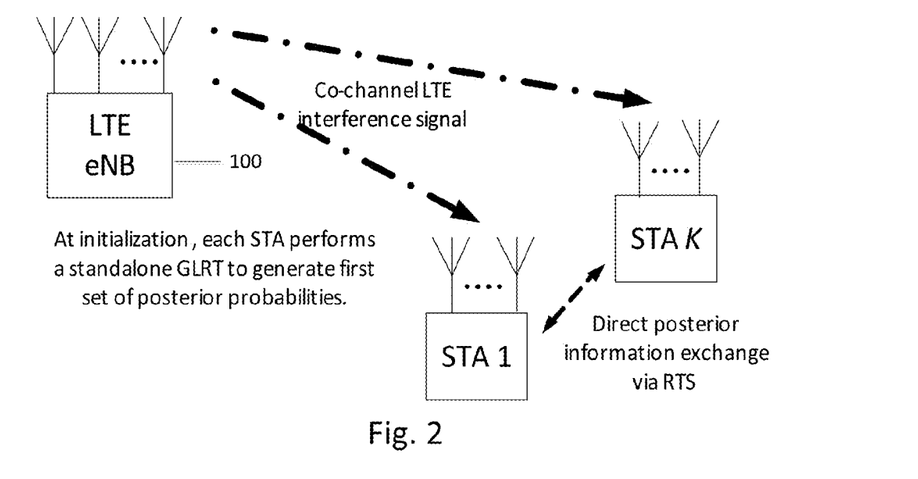
FIG. 2 illustrates an example of a system, according to one embodiment.

FIG. 2 illustrates an example of a system depicting the direct message exchange between STAs, according to one embodiment. In the example of FIG. 2, LTE eNB 100 may be transmitting a signal causing co-channel interference. STAs (e.g., STA 1, STA k) monitor channel and exchange posterior probabilities by piggybacking onto control packets. When direct message (probability) exchange is desired, the STAs (e.g., STA 1, STA k) send their messages embedded, for example, in the PHY header of control packets such as RTS, CTS, and ACK, either by using reserved bits in the SIG field or by defining a new field used exclusively for these messages.

Figure 3:
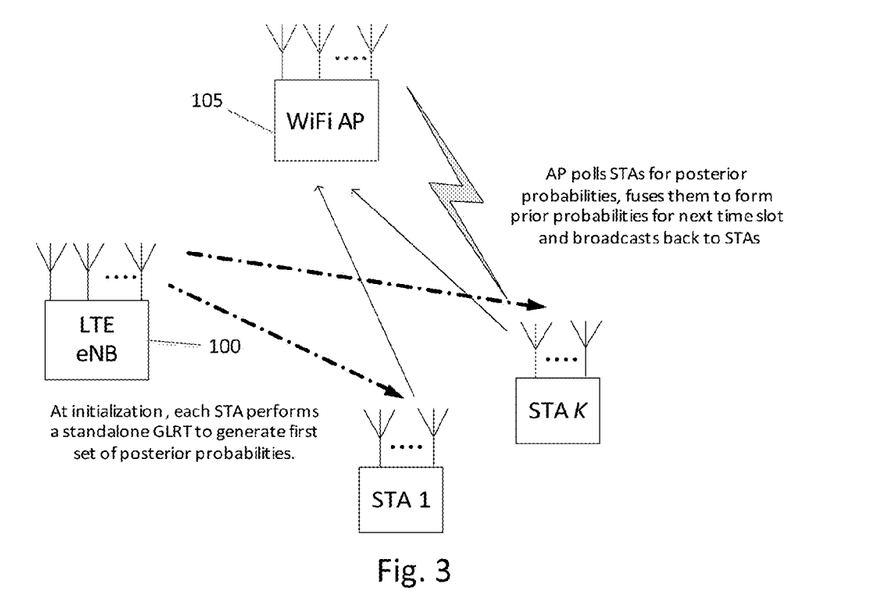
FIG. 3 illustrates an example of a system, according to another embodiment.

FIG. 3 illustrates an example of a system depicting AP-assisted probability exchange, according to one embodiment. The AP-assisted probability exchange may be applicable in the case of low-power terminals that are not monitoring the channel continuously. In the example of FIG. 3, the AP 105 collects the individual posterior probabilities from the STAs (e.g., STA 1, STA k), uses an arbitrary fusion rule to compute a global prior probability to be used for the next detection period, and broadcasts it back to the STAs.

An advantage of broadcasting and sharing probability information with neighboring STAs is that the reliability of the detection process is improved due to spatial diversity. A particular STA may be under shadowing or extended deep fade with respect to the LTE eNB 100, in which case receiving information from a non-colocated STA will ensure that the correct signal classification is made more likely.

In one embodiment, the prior probabilities may be updated periodically since the LTE and WiFi signal activity is dynamically time-varying.

Figure 4:
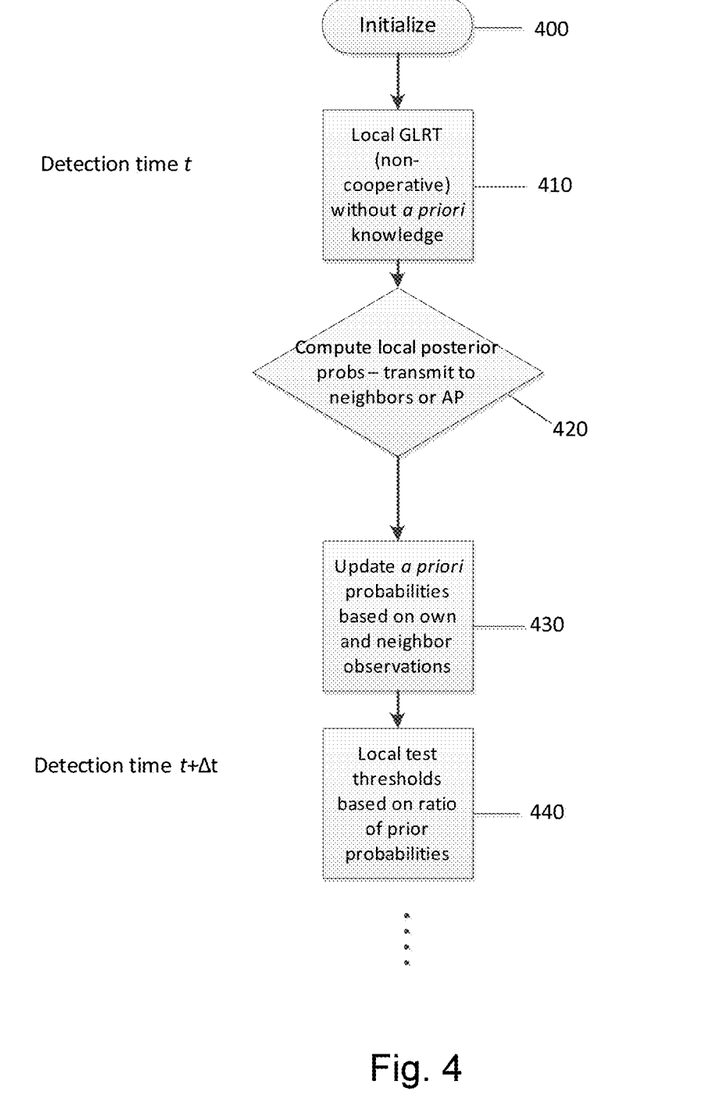
FIG. 4 illustrates a flow diagram of a process according to one embodiment.

FIG. 4 illustrates a flow diagram depicting the overall sequence of events in the signal classification and detection process, according to one embodiment. As illustrated in FIG. 4, at 400, the STAs are initialized. At 410, the STAs perform local GLRT without a priori knowledge. At 420, the STAs compute local posterior probabilities and transmit the computed probabilities to neighbor STAs and/or to the AP. At 430, the STAs update a priori probabilities based on their own observations as well as those received from neighbor STAs either directly or via the AP. At 440, the STAs perform local threshold tests based on the ratio of prior probabilities.

The following provides an example implementation of the GLRT process assuming the lack of any a priori information, such as at the initialization stage, according to one embodiment. Let $P_{FA,1} = Pr\{\ln(L_{0,1}(Y) > \eta_{0,1}) | H_0\}$ and $P_{FA,2} = Pr\{\ln$ $(L_{0,2}(Y) > \eta_{0,2}) | H_0\}$ be the local false alarm probabilities of the first two tests. The global (overall) false alarm probability is approximated as:

$$P_{FA} = Pr\{\hat{H}_1 | H_0\} + Pr\{\hat{H}_2 | H_0\} \cong P_{FA,1} + P_{FA,2} \quad (11)$$

Without loss of generality, embodiments can set $P_{FA,1} = P_{FA,2}$. Thus, for a given $P_{FA}$ requirement, the local false-alarm constraints $P_{FA,1} = P_{FA,2} = 0.5 P_{FA}$ are obtained, from which we can then determine the test thresholds $\eta_{0,1}$, $\eta_{0,2}$. The false-alarm is independent of the third test $L_{1,2}(Y)$.

All three thresholds can be computed numerically via Monte Carlo trials. Alternatively, an analytical approach is described next for test thresholds $\eta_{0,1}$, $\eta_{0,2}$. Taking the logarithm of the LRT $L_{0,1}(Y)$, substituting in the maximum-likelihood estimates of unknown parameters and some simplifications yields:

$$P_{FA,1} = Pr\left\{\frac{1}{\sigma_n^2} Tr((I - P_w^H P_w) Y Y^H) > \eta_{0,1} \,\bigg|\, H_0\right\} \quad (12)$$

where $P_w = I - X_w (X_w^H X_w)^{-1} X_w^H$ is a deterministic matrix. Under hypothesis $H_0$ signal Y is a zero-mean complex Gaussian matrix, therefore $YY^H$ is a central Wishart random matrix. Let $\{\gamma_k\}$ and $\{\lambda_k\}$ be the ordered complex eigenvalues of Hermitian matrices $(I - P_w^H P_w)$ and $YY^H$ respectively. Exploiting an eigenvalue inequality for the product of Hermitian matrices, gives:

$$Tr((I - P_w^H P_w) Y Y^H) \le \sum_k \gamma_k \lambda_k \le \gamma_1 \sum_k \lambda_k \quad (13)$$

where $\gamma_1$ is the largest eigenvalue. The sum of the eigenvalues of Wishart matrix $YY^H$, which is equal to the sum of the diagonal elements, follows a chi-squared distribution with 2N degrees of freedom, therefore:

$$P_{FA,1} \le Pr\left\{\sum_k \lambda_k > \frac{\sigma_n^2 \eta_{0,1}}{\gamma_1}\right\} = 1 - \tilde{\Gamma}\left(N, \frac{\sigma_n^2 \eta_{0,1}}{2\gamma_1}\right) \quad (14)$$

where $\tilde{\Gamma}(\bullet, \bullet)$ is the regularized Gamma function. Thus, for a given $P_{FA,1}$ requirement, we can find the test threshold $\eta_{0,1}$ by numerically inverting the regularized Gamma function. A similar approach holds for determining threshold $\eta_{0,2}$ analytically.

Figure 5A:
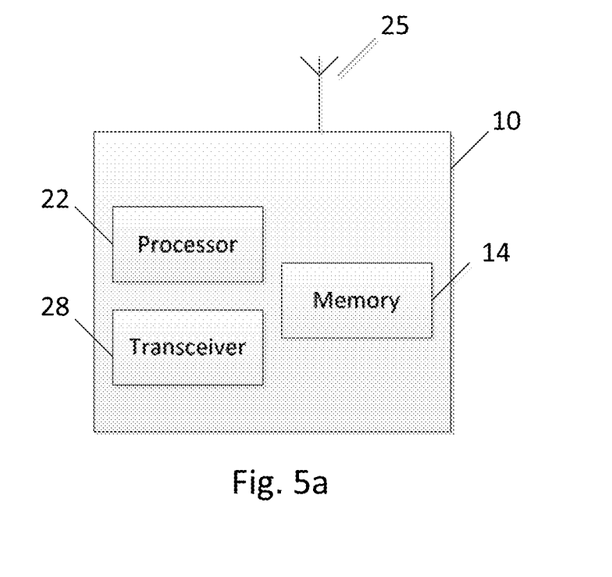
FIG. 5a illustrates an example of an apparatus according to an embodiment.

FIG. 5a illustrates an example of an apparatus 10 according to an embodiment. In one embodiment, apparatus 10 may be a STA including a WiFi receiver. It should be noted that one of ordinary skill in the art would understand that apparatus 10 may include components or features not shown in FIG. 5a. Only those components or feature necessary for illustration of the invention are depicted in FIG. 5a.

As illustrated in FIG. 5a, apparatus 10 includes a processor 22 for processing information and executing instructions or operations. Processor 22 may be any type of general or specific purpose processor. While a single processor 22 is shown in FIG. 5a, multiple processors may be utilized according to other embodiments. In fact, processor 22 may include one or more of general-purpose computers, special purpose computers, microprocessors, digital signal processors (DSPs), field-programmable gate arrays (FPGAs), application-specific integrated circuits (ASICs), and processors based on a multi-core processor architecture, as examples.

Apparatus 10 further includes a memory 14, which may be coupled to processor 22, for storing information and instructions that may be executed by processor 22. Memory 14 may be one or more memories and of any type suitable to the local application environment, and may be implemented using any suitable volatile or nonvolatile data storage technology such as a semiconductor-based memory device, a magnetic memory device and system, an optical memory device and system, fixed memory, and removable memory. For example, memory 14 can be comprised of any combination of random access memory (RAM), read only memory (ROM), static storage such as a magnetic or optical disk, or any other type of non-transitory machine or computer readable media. The instructions stored in memory 14 may include program instructions or computer program code that, when executed by processor 22, enable the apparatus 10 to perform tasks as described herein.

Apparatus 10 may also include one or more antennas 25 for transmitting and receiving signals and/or data to and from apparatus 10. Apparatus 10 may further include a transceiver 28 configured to transmit and receive information. For instance, transceiver 28 may be configured to modulate information on to a carrier waveform for transmission by the antenna(s) 25 and demodulates information received via the antenna(s) 25 for further processing by other elements of apparatus 10. In other embodiments, transceiver 28 may be capable of transmitting and receiving signals or data directly.

Processor 22 may perform functions associated with the operation of apparatus 10 including, without limitation, precoding of antenna gain/phase parameters, encoding and decoding of individual bits forming a communication message, formatting of information, and overall control of the apparatus 10, including processes related to management of communication resources.

In an embodiment, memory 14 stores software modules that provide functionality when executed by processor 22. The modules may include, for example, an operating system that provides operating system functionality for apparatus 10. The memory may also store one or more functional modules, such as an application or program, to provide additional functionality for apparatus 10. The components of apparatus 10 may be implemented in hardware, or as any suitable combination of hardware and software.

As mentioned above, according to one embodiment, apparatus 10 may be a STA. In an embodiment, apparatus 10 may be controlled by memory 14 and processor 22, to detect a presence of a signal and to classify the signal according to type. In one embodiment, there may be at least three possibilities for the type of signal. Apparatus 10 may be further controlled to classify the signal by performing a generalized likelihood ratio test (GLRT), as outlined in detail above, for the at least three possibilities.

Figure 5B:
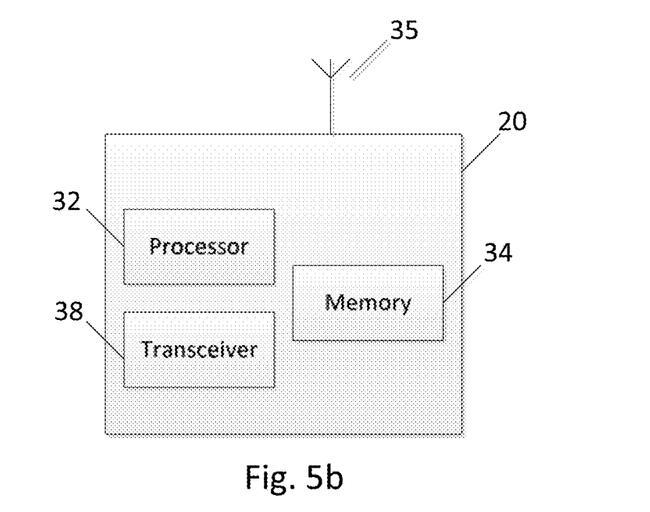
FIG. 5b illustrates an example of an apparatus according to another embodiment.

FIG. 5b illustrates an example of an apparatus 20 according to another embodiment. In an embodiment, apparatus 20 may be an AP, such as WiFi AP 105 shown in FIG. 3 discussed above. It should be noted that one of ordinary skill in the art would understand that apparatus 20 may include components or features not shown in FIG. 5b. Only those components or feature necessary for illustration of the invention are depicted in FIG. 5b.

As illustrated in FIG. 5b, apparatus 20 includes a processor 32 for processing information and executing instructions or operations. Processor 32 may be any type of general or specific purpose processor. While a single processor 32 is shown in FIG. 5b, multiple processors may be utilized according to other embodiments. In fact, processor 32 may include one or more of general-purpose computers, special purpose computers, microprocessors, digital signal processors (DSPs), field-programmable gate arrays (FPGAs), application-specific integrated circuits (ASICs), and processors based on a multi-core processor architecture, as examples.

Apparatus 20 further includes a memory 34, which may be coupled to processor 32, for storing information and instructions that may be executed by processor 32. Memory 34 may be one or more memories and of any type suitable to the local application environment, and may be implemented using any suitable volatile or nonvolatile data storage technology such as a semiconductor-based memory device, a magnetic memory device and system, an optical memory device and system, fixed memory, and removable memory. For example, memory 34 can be comprised of any combination of random access memory (RAM), read only memory (ROM), static storage such as a magnetic or optical disk, or any other type of non-transitory machine or computer readable media. The instructions stored in memory 34 may include program instructions or computer program code that, when executed by processor 32, enable the apparatus 20 to perform tasks as described herein.

Apparatus 20 may also include one or more antennas 35 for transmitting and receiving signals and/or data to and from apparatus 20. Apparatus 20 may further include a transceiver 38 configured to transmit and receive information. For instance, transceiver 38 may be configured to modulate information on to a carrier waveform for transmission by the antenna(s) 35 and demodulates information received via the antenna(s) 35 for further processing by other elements of apparatus 20. In other embodiments, transceiver 38 may be capable of transmitting and receiving signals or data directly.

Processor 32 may perform functions associated with the operation of apparatus 20 including, without limitation, precoding of antenna gain/phase parameters, encoding and decoding of individual bits forming a communication message, formatting of information, and overall control of the apparatus 20, including processes related to management of communication resources.

In an embodiment, memory 34 stores software modules that provide functionality when executed by processor 32. The modules may include, for example, an operating system that provides operating system functionality for apparatus 20. The memory may also store one or more functional modules, such as an application or program, to provide additional functionality for apparatus 20. The components of apparatus 20 may be implemented in hardware, or as any suitable combination of hardware and software.

As mentioned above, according to one embodiment, apparatus 20 may be an AP, such as a WiFi AP. In this embodiment, apparatus 20 may be controlled by memory 34 and processor 32 to collect individual posterior probabilities from a plurality of STAs. Apparatus 20 may then be controlled to use an arbitrary fusion rule to compute a global prior probability from individual posterior probabilities. In one embodiment, the global prior probability may be used for a next detection period. Apparatus 20 may then be controlled by memory 34 and processor 32 to broadcast the computed global prior probability to the plurality of STAs.

Figure 6:
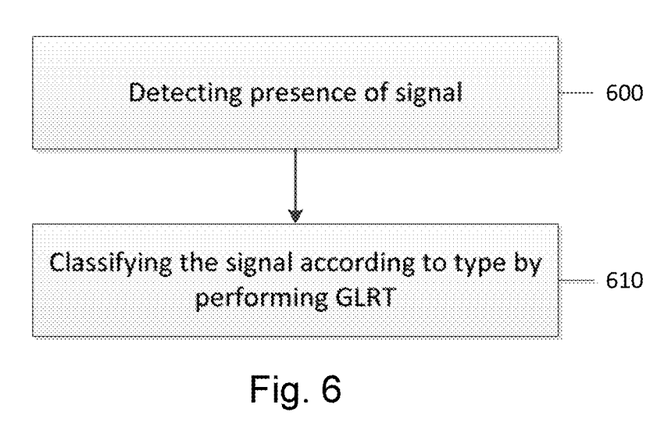
FIG. 6 illustrates a flow diagram of a method according to one embodiment.

FIG. 6 illustrates an example of a flow diagram of a method, according to one embodiment. In one example, the method of FIG. 6 may be performed by a STA. The method may include, at 600, detecting, by the STA, a presence of a signal and, at 610, classifying the signal according to its type. According to one embodiment, there may be at least three possibilities for the type of signal. The classifying of the signal may include performing, by the STA, a generalized likelihood ratio test (GLRT), as outlined in detail above, for the at least three possibilities.

Figure 7:
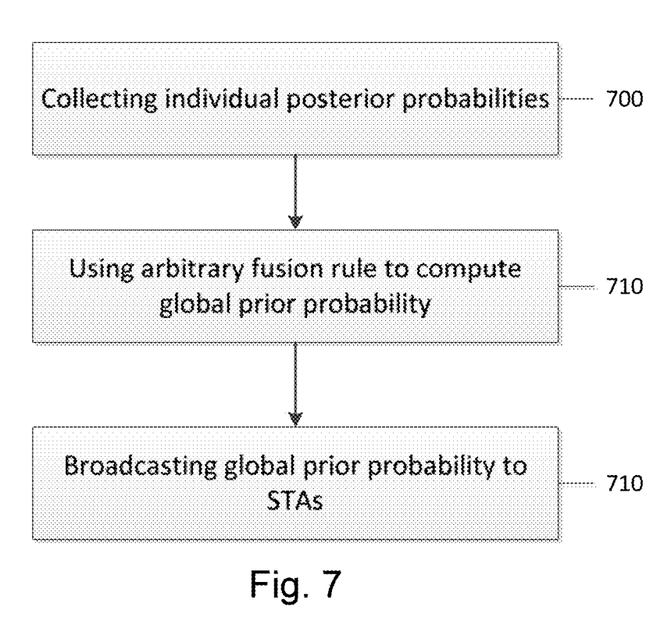
FIG. 7 illustrates a flow diagram of a method according to another embodiment.

FIG. 7 illustrates an example of a flow diagram of a method, according to another embodiment. In an embodiment, the method of FIG. 7 may be performed by an AP. The method may include, at 700, collecting, by the AP, individual posterior probabilities from a plurality of STAs. The method may also include, at 710, using an arbitrary fusion rule to compute a global prior probability from the individual posterior probabilities. For example, the global prior probability may be used for a next detection period. The method may also include, at 720, broadcasting, by the AP, the computed global prior probability to the plurality of STAs.

In some embodiments, the functionality of any of the methods described herein, such as those illustrated in FIGS. 6 and 7 discussed above, may be implemented by software and/or computer program code stored in memory or other computer readable or tangible media, and executed by a processor. In other embodiments, the functionality may be performed by hardware, for example through the use of an application specific integrated circuit (ASIC), a programmable gate array (PGA), a field programmable gate array (FPGA), or any other combination of hardware and software.

Figure 8:
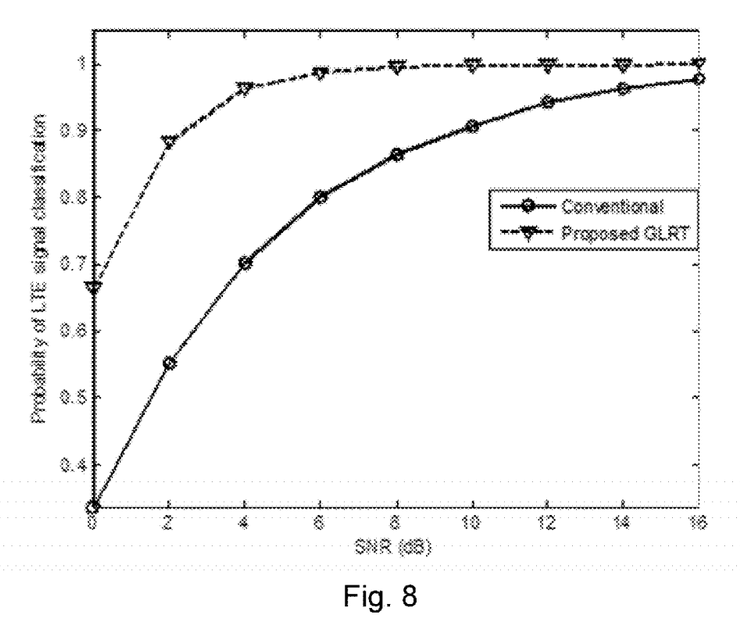
FIG. 8 illustrates a graph depicting a performance comparison of the probability of correct LTE signal classification, according to an embodiment.

Considering a system with $N_{t,L}=N_{t,W}=N_r=4$ antennas and $N=64$ FFT size, false-alarm constraint of 10-3, Rayleigh fading channels, unit-variance AWGN, 3 multipaths, and randomly generated phase offset per received subcarrier. Each hypothesis is set to be equally likely in the simulation. FIG. 8 illustrates a graph depicting the probability of correct LTE signal classification. More specifically, FIG. 8 illustrates a performance comparison in terms of the signal classification probability of the conventional 2-stage cross-correlation detector and the GLRT method according to certain embodiments of the invention. As can be seen from FIG. 8, the GLRT method according to an embodiment of the invention (shown with the dotted line) is observed to have a significantly higher classification rate (near 100% for moderate to higher SNR) for the same false-alarm rate. In other words, the WiFi receiver is able to correctly distinguish between LTE and WiFi signals and take appropriate measures to avoid interference based on this knowledge.

Certain embodiments of the invention provide several technical effects. For example, as a result of some embodiments, WiFi receivers can correctly distinguish between the presence of interfering LTE or desired WiFi signals at the physical layer, without the need for explicit cross-technology control channels between LTE and WiFi or feedback from LTE. In contrast, conventional WiFi signal detection based on autocorrelation cannot do better than 0.5 probability of correct signal classification in such scenarios. According to certain embodiments, Wi-Fi terminals do not need to be equipped with an LTE radio. In addition, embodiments are applicable to both time division duplex (TDD)-LTE and frequency division duplex (FDD)-LTE. Certain embodiments are essential for LTE and WiFi coexistence and provide important steps in the interference avoidance process. In addition, the general principle of embodiments of the invention can easily be extended for coexistence of WiFi with other WAN protocols and, therefore, is not limited to LTE.

One having ordinary skill in the art will readily understand that the invention as discussed above may be practiced with steps in a different order, and/or with hardware elements in configurations which are different than those which are disclosed. Therefore, although the invention has been described based upon these preferred embodiments, it would be apparent to those of skill in the art that certain modifications, variations, and alternative constructions would be apparent, while remaining within the spirit and scope of the invention. In order to determine the metes and bounds of the invention, therefore, reference should be made to the appended claims.

We claim:

1. A method, comprising:
   detecting, by a station, a presence of a signal;
   classifying the signal according to type, wherein there are at least three possibilities for the type of signal;
   wherein the classifying comprises performing a composite hypothesis test,
   wherein the at least three possibilities are represented by $H_0$, $H_1$, and $H_2$, respectively,
   wherein possibility $H_0$ represents that the signal is only additive Gaussian noise,
   wherein possibility $H_1$ represents that the signal is a WiFi signal plus Gaussian noise,
   wherein possibility $H_2$ represents that the signal is a long term evolution (LTE) signal plus Gaussian noise, and
   wherein the at least three possibilities are represented mathematically in a time-domain as:

$Y=N$  $H_0$:

$Y=X_w H_w + N$  $H_1$:

$Y=X_l H_l + Z_l + N$  $H_2$:

where a received time-domain signal matrix Y is of dimension $(N \times N_r)$, the LTE and WiFi transmitters have $N_{t,L}$ and $N_{t,W}$ antennas, respectively, $H_w$ and $H_l$ are time-domain channel matrices of dimension $(LN_{t,W} \times N_r)$ and $(LN_{t,L} \times N_r)$ where L is a number of multipaths in the frequency-selective fading channels, $X_w$ is a WiFi short training field (STF) of dimension $(N \times LN_{t,W})$, $X_l$ is a LTE signal of dimension $(N \times LN_{t,L})$, $Z_l$ is a time-domain inter-carrier interference (ICI) of dimension $(N \times N_r)$ due to LTE-WiFi technology mismatch, and N is zero-mean circularly symmetric complex additive white Gaussian noise.

2. The method according to claim 1, wherein performing of the composite hypothesis test comprises performing generalized likelihood ratio test (GLRT) for the at least three possibilities.

3. The method according to claim 2, wherein the performing of the generalized likelihood ratio test (GLRT) comprises performing at least three parallel threshold tests in which likelihood ratios of the at least three possibilities are compared with a set of thresholds.

4. The method according to claim 3, wherein a logarithm of the likelihood ratios are compared with the set of thresholds.

5. The method according to claim 3, further comprising feeding an output of each of the threshold tests into a digital logic circuit configured to compute a final estimate of which one of the at least three possibilities is believed to be true.

6. The method according to claim 1, wherein the signal follows a complex Gaussian matrix distribution for each of the at least three possibilities:

$Y \sim CN(0, \sigma_n^2 I)$  $H_0$:

$Y \sim CN(X_w H_w, \sigma_n^2 I)$  $H_1$:

$Y \sim CN(X_l H_l + Z_l, \sigma_n^2 I)$.  $H_2$:

7. The method according to claim 1, wherein corresponding probability density functions conditioned on unknown parameters for the respective possibilities are given by:

$$f(Y; H_0) = \frac{1}{(\pi \sigma_n^2)^{NN_r}} \exp\left\{-\frac{Tr(Y^H Y)}{\sigma_n^2}\right\},$$

$$f(Y; H_1) = \frac{1}{(\pi \sigma_n^2)^{NN_r}} \exp\left\{-\frac{Tr((Y - X_w H_w)^H (Y - X_w H_w))}{\sigma_n^2}\right\},$$

$$f(Y; H_2) = \frac{1}{(\pi \sigma_n^2)^{NN_r}} \exp\left\{-\frac{Tr((Y - X_l H_l - Z_l)^H (Y - X_l H_l - Z_l))}{\sigma_n^2}\right\}.$$

8. The method according to claim 7, wherein the threshold tests are obtained to be of the form:

$$L_{i,j}(Y) = \frac{f(Y; H_j)}{f(Y; H_i)} \lessgtr \eta_{i,j}$$

$$i, j = 0, 1, 2, i < j,$$

wherein the unknown parameters $H_w$ and $H_l$ are replaced with their maximum likelihood estimates:

$$\hat{H}_w = (X_w^H X_w)^{-1} X_w^H Y$$

$$\hat{H}_l = (X_l^H X_l)^{-1} X_l^H Y.$$

9. The method according to claim 1, wherein, when the station has a priori probabilities information regarding the likelihood of each of the at least three possibilities, setting the set of thresholds to be the ratios of the a priori probabilities.

10. The method according to claim 9, wherein the a priori probabilities of each of the at least three possibilities at an arbitrary station s and detection time t are written as:

$P_{s,0}^{(t)} = Pr\{H_0; t\} P_{s,1}^{(t)} = Pr\{H_1; t\} P_{s,2}^{(t)} = Pr\{H_2; t\}$.

11. The method according to claim 1, wherein, at initialization of the station, the performing comprises the station performing a standalone generalized likelihood ratio test (GLRT) to generate a set of posterior probabilities.

12. The method according to claim 11, further comprising directly exchanging, by the station, the set of posterior probabilities with other stations.

13. The method according to claim 12, wherein the directly exchanging comprises including the set of posterior probabilities in a header of control packets sent to the other stations.

14. The method according to claim 12, further comprising transmitting the set of posterior probabilities to an access point.

15. The method according to claim 11, wherein, when the station does not have a priori probabilities information regarding the likelihood of each of the at least three possibilities, selecting the set of thresholds by the station based on the standalone generalized likelihood ratio test (GLRT) to be below a global false alarm probability threshold.

16. An apparatus, comprising:
    at least one processor; and
    at least one memory comprising computer program code,
    the at least one memory and the computer program code configured, with the at least one processor, to cause the apparatus at least to
    detect a presence of a signal;
    classify the signal according to type, wherein there are at least three possibilities for the type of signal;
    wherein the apparatus is configured to classify the signal by performing a composite hypothesis test,
    wherein the at least three possibilities are represented by $H_0$, $H_1$, and $H_2$, respectively, wherein possibility $H_0$ represents that the signal is only additive Gaussian noise, wherein possibility $H_1$ represents that the signal is a WiFi signal plus Gaussian noise, wherein possibility $H_2$ represents that the signal is a long term evolution (LTE) signal plus Gaussian noise, and wherein the at least three possibilities are represented mathematically in a time-domain as:

$$Y=N \qquad H_0:$$

$$Y=X_w H_w+N \qquad H_1:$$

$$Y=X_l H_l+Z_l+N \qquad H_2:$$

where a received time-domain signal matrix Y is of dimension $(N \times N_r)$, the LTE and WiFi transmitters have $N_{t,L}$ and $N_{t,W}$ antennas, respectively, $H_w$ and $H_l$ are time-domain channel matrices of dimension $(LN_r \times N_r)$ and $(LN_{t,L} \times N_r)$ where L is a number of multipaths in the frequency-selective fading channels, $X_w$ is a WiFi short training field (STF) of dimension $(N \times LN_{t,W})$, $X_l$ is a LTE signal of dimension $(N \times LN_{t,L})$, $Z_l$ is a time-domain inter-carrier interference (ICI) of dimension $(N \times N_r)$ due to LTE-WiFi technology mismatch, and N is zero-mean circularly symmetric complex additive white Gaussian noise.

17. The apparatus according to claim 16, wherein the composite hypothesis test comprises a generalized likelihood ratio test (GLRT) for the at least three possibilities.

18. The apparatus according to claim 17, wherein the performing of the generalized likelihood ratio test (GLRT) comprises performing at least three parallel threshold tests in which likelihood ratios of the at least three possibilities are compared with a set of thresholds.

19. The apparatus according to claim 18, wherein a logarithm of the likelihood ratios are compared with the set of thresholds.

20. The apparatus according to claim 18, wherein an output of each of the threshold tests is fed into a digital logic circuit configured to compute a final estimate of which one of the at least three possibilities is believed to be true.

21. The apparatus according to claim 16, wherein the signal follows a complex Gaussian matrix distribution for each of the at least three possibilities as follows:

$$Y \sim CN(0, \sigma_n^2 I) \qquad H_0:$$

$$Y \sim CN(X_w H_w, \sigma_n^2 I) \qquad H_1:$$

$$Y \sim CN(X_l H_l+Z_l, \sigma_n^2 I). \qquad H_2:$$

22. The apparatus according to claim 16, wherein corresponding probability density functions conditioned on unknown parameters for the respective possibilities are given by:

$$f(Y; H_0) = \frac{1}{(\pi \sigma_n^2)^{NN_r}} \exp\left\{-\frac{Tr(Y^H Y)}{\sigma_n^2}\right\},$$

$$f(Y; H_1) = \frac{1}{(\pi \sigma_n^2)^{NN_r}} \exp\left\{-\frac{Tr((Y - X_w H_w)^H (Y - X_w H_w))}{\sigma_n^2}\right\},$$

$$f(Y; H_2) = \frac{1}{(\pi \sigma_n^2)^{NN_r}} \exp\left\{-\frac{Tr((Y - X_l H_l - Z_l)^H (Y - X_l H_l - Z_l))}{\sigma_n^2}\right\}.$$

23. The apparatus according to claim 22, wherein the threshold tests are obtained to be of the form:

$$L_{i,j}(Y) = \frac{f(Y; H_j)}{f(Y; H_i)} \lessgtr \eta_{i,j}$$

$$i, j = 0, 1, 2, i < j,$$

wherein the unknown parameters $H_w$ and $H_l$ are replaced with their maximum likelihood estimates:

$$\hat{H}_w = (X_w^H X_w)^{-1} X_w^H Y$$

$$\hat{H}_l = (X_l^H X_l)^{-1} X_l^H Y.$$

24. The apparatus according to claim 16, wherein, when the apparatus has a priori probabilities information regarding the likelihood of each of the at least three possibilities, the apparatus is configured to set the set of thresholds to be the ratios of the a priori probabilities.

25. The apparatus according to claim 24, wherein the a priori probabilities of each of the at least three possibilities at an arbitrary station s and detection time t are written as:

$$P_{s,0}^{(t)} = Pr\{H_0; t\} P_{s,1}^{(t)} = Pr\{H_1; t\} P_{s,2}^{(t)} = Pr\{H_2; t\}.$$

26. The apparatus according to claim 16, wherein, at initialization of the apparatus, the at least one memory and the computer program code are further configured, with the at least one processor, to cause the apparatus to perform a standalone generalized likelihood ratio test (GLRT) to generate a set of posterior probabilities.

27. The apparatus according to claim 26, wherein the at least one memory and the computer program code are further configured, with the at least one processor, to cause the apparatus to directly exchange the set of posterior probabilities with other stations.

28. The apparatus according to claim 27, wherein the at least one memory and the computer program code are further configured, with the at least one processor, to cause the apparatus to include the set of posterior probabilities in a header of control packets sent to the other stations.

29. The apparatus according to claim 26, wherein the at least one memory and the computer program code are further configured, with the at least one processor, to cause the apparatus to transmit the set of posterior probabilities to an access point.

30. The apparatus according to claim 26, wherein, when the station does not have a priori probabilities information regarding the likelihood of each of the at least three possibilities, selecting the set of thresholds by the station based on the standalone generalized likelihood ratio test (GLRT) to be below a global false alarm probability threshold.

31. A computer program, embodied on a non-transitory computer readable medium, wherein the computer program is configured to control a processor to perform a process, comprising:

detecting a presence of a signal;

classifying the signal according to type, wherein there are at least three possibilities for the type of signal;

wherein the classifying comprises performing a composite hypothesis test, wherein the at least three possibilities are represented by $H_0$, $H_1$, and $H_2$, respectively, wherein possibility $H_0$ represents that the signal is only additive Gaussian noise, wherein possibility $H_1$ represents that the signal is a WiFi signal plus Gaussian noise, wherein possibility $H_2$ represents that the signal is a long term evolution (LTE) signal plus Gaussian noise, and wherein the at least three possibilities are represented mathematically in a time-domain as:

$$Y = N \qquad H_0:$$

$$Y = X_w H_w + N \qquad H_1:$$

$$Y = X_l H_l + Z_l + N \qquad H_2:$$

where a received time-domain signal matrix Y is of dimension $(N \times N_r)$, the LTE and WiFi transmitters have $N_{t,L}$ and $N_{t,W}$ antennas, respectively, $H_w$ and $H_l$ are time-domain channel matrices of dimension $(LN_{t,W} \times N_r)$ and $(LN_{t,L} \times N_r)$ where L is a number of multipaths in the frequency-selective fading channels, $X_w$ is a WiFi short training field (STF) of dimension $(N \times LN_{t,W})$, $X_l$ is a LTE signal of dimension $(N \times LN_{t,L})$, $Z_l$ is a time-domain inter-carrier interference (ICI) of dimension $(N \times N_r)$ due to LTE-WiFi technology mismatch, and N is zero-mean circularly symmetric complex additive white Gaussian noise.

* * * * *